United States Patent
Alhussien et al.

(10) Patent No.: US 8,879,324 B2
(45) Date of Patent: Nov. 4, 2014

(54) COMPENSATION LOOP FOR READ VOLTAGE ADAPTATION

(71) Applicant: LSI Corporation, San Jose, CA (US)

(72) Inventors: Abdel-Hakim S. Alhussien, San Jose, CA (US); Yunxiang Wu, Cupertino, CA (US); Erich F. Haratsch, Allentown, PA (US); Jamal Riani, San Jose, CA (US)

(73) Assignee: LSI Corporation, San Jose, CA (US)

( * ) Notice: Subject to any disclaimer, the term of this patent is extended or adjusted under 35 U.S.C. 154(b) by 114 days.

(21) Appl. No.: 13/757,027

(22) Filed: Feb. 1, 2013

(65) Prior Publication Data

US 2014/0219028 A1   Aug. 7, 2014

(51) Int. Cl.
*G11C 16/04*   (2006.01)
*G11C 16/26*   (2006.01)

(52) U.S. Cl.
CPC ....................................... *G11C 16/26* (2013.01)
USPC .............. 365/185.18; 365/185.33; 365/185.21

(58) Field of Classification Search
USPC ................ 365/185.18, 185.33, 185.21, 185.2
See application file for complete search history.

(56) References Cited

U.S. PATENT DOCUMENTS 8,467,249 B2 *   6/2013   Katz et al. ................ 365/185.18

\* cited by examiner

*Primary Examiner* — David Lam
(74) *Attorney, Agent, or Firm* — Suiter Swantz pc llo

(57) ABSTRACT

The disclosure is directed to a system and method for nominal read voltage variations of a flash device. N reads are performed, each at a selected voltage offset from an initial read voltage. An N bit digital pattern associated with the selected voltage offsets is generated for the N reads. The N bit digital pattern generated by the N reads is mapped to a signed representation. A voltage adjustment based upon the signed representation is applied to at least partially compensate for a variation of the nominal read voltage to reduce bit error rate of the flash device.

20 Claims, 6 Drawing Sheets

COMPENSATION LOOP FOR READ VOLTAGE ADAPTATION

FIELD OF INVENTION

The disclosure relates to the field of flash devices and to controlling voltage levels for flash devices.

BACKGROUND

Flash devices can experience drifts or other variations in a flash cell's nominal voltage caused by retention, write endurance, or other factors. In such cases, it is not possible to detect and correct for the corresponding change in the optimal read voltage with analog voltage regulators. As such, nominal voltage offsets and random variations can degrade flash storage system performance and lifespan.

SUMMARY

An embodiment of the disclosure includes a system for compensating for nominal voltage variation by tracking read voltage offsets. At a selected time or upon the occurrence of a predetermined event, a flash device is configured to execute N reads. Each of the N reads is executed at a selected voltage offset from an initial nominal read voltage. This nominal voltage is tracked constantly to ensure that the resulting bit error rate is reduced at various stages of the flash device life. The N reads generate a respective N bit digital pattern associated with the selected voltage offsets. A mapping module is configured to receive the N bit digital pattern generated by the N reads. The mapping module is further configured to map the N bit digital pattern to a signed representation. A voltage compensator is configured to provide a voltage adjustment to the nominal read voltage based upon the statistics of observed signed representation to at least partially compensate for the deterministic and random variations of the nominal voltage.

It is to be understood that both the foregoing general description and the following detailed description are not necessarily restrictive of the disclosure. The accompanying drawings, which are incorporated in and constitute a part of the specification, illustrate embodiments of the disclosure.

BRIEF DESCRIPTION OF THE DRAWINGS

The embodiments of the disclosure may be better understood by those skilled in the art by reference to the accompanying figures in which.

DETAILED DESCRIPTION

Reference will now be made in detail to the embodiments disclosed, which are illustrated in the accompanying drawings.

FIGS. 1 through 6 illustrate embodiments of a system and method for compensating nominal read voltage variations utilizing a digital adaptive compensation loop. Shifts or offsets in the nominal read voltage of a flash device result in degraded performance and shorter lifespan of disk drives and other storage systems based on flash memory components. In some embodiments, a fully blind compensation scheme (requiring no pre-stored offset data) adjusts for read voltage variations across different pages, blocks, or dies. Furthermore, acquisition time can be controlled because the compensation loop is enabled to automatically acquire offsets for sets of pages or blocks without need for pre-stored values.

Figure 1:
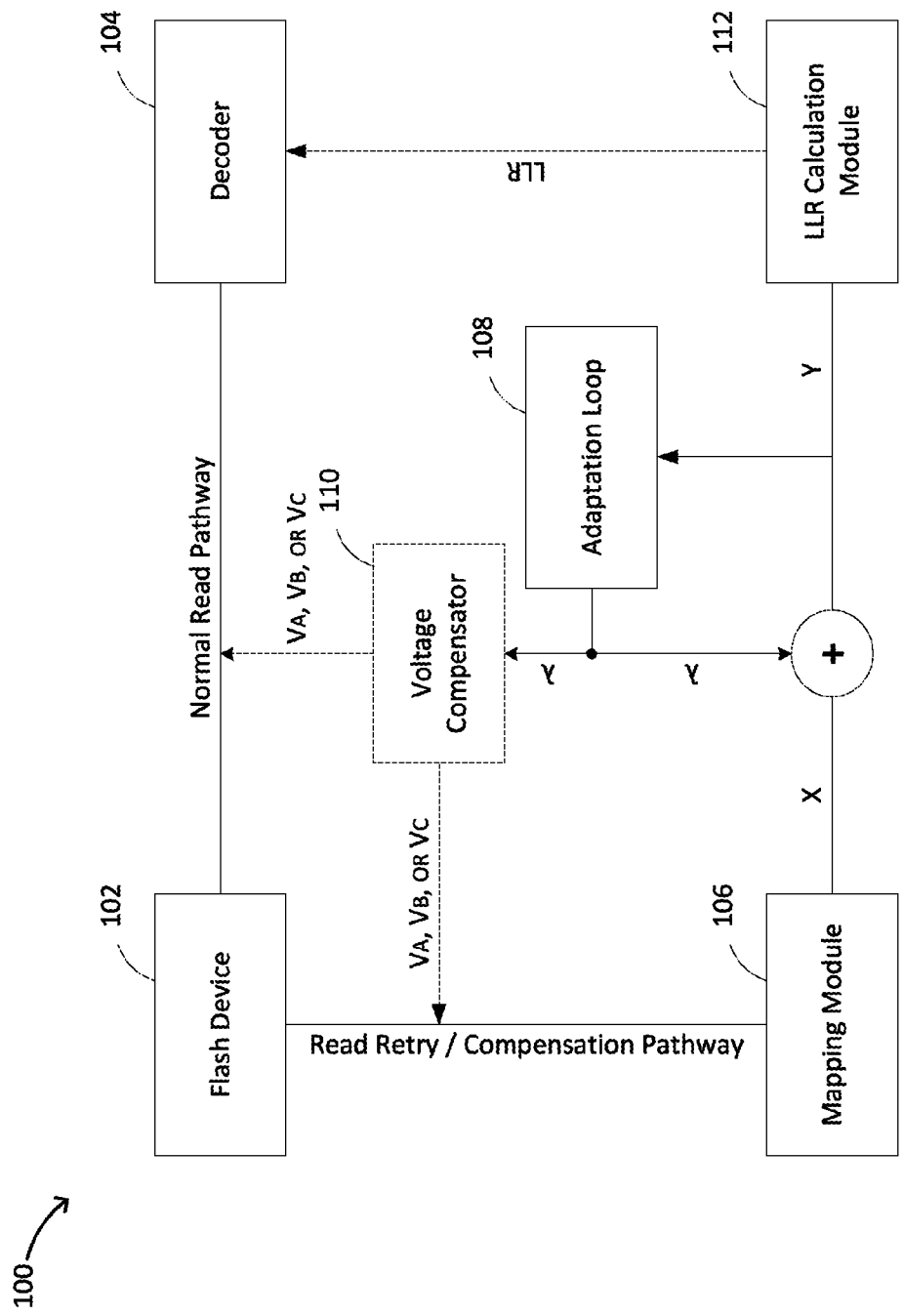
FIG. 1 is a block diagram illustrating a system for compensating a nominal read voltage variation, in accordance with an embodiment of the disclosure.

In an embodiment, as illustrated in FIG. 1, a system 100 for compensating nominal read voltage variations for a flash device 102 includes at least two read paths. When the compensation loop is not enabled, the flash device 102 is configured to execute reads utilizing a normal read path linking a decoder 104 such as, but not limited to, a soft or hard error correction coding (ECC) decoder. In some embodiments, the decoder 104 is a low-density parity-check (LDPC) decoder. The normal read path employs the nominal read voltage which is tracked using the output of the digital compensation loop.

In some embodiments, the compensation loop is integrated with a read-retry path of a read channel. In other embodiments, the compensation loop is in a compensation path that is distinct from or in place of the read-retry path. The compensation loop is accordingly enabled when a predetermined event occurs such as, but not limited to, startup, read failure, or offset detection. In some embodiments, the compensation loop is enabled periodically, manually, or at one or more selected or programmed times, such as after a selected number of program/erase memory cycles occurs (e.g. every 2000 P/E cycles).

When the compensation loop is enabled, the flash device 102 is configured to perform a selected number of reads, N reads. Each of the N reads is performed at a respective voltage offset from an initial nominal read voltage of the flash device 102. The flash device 102 is further configured to output a digital pattern for the N reads having a selected number of bits. In some embodiments, the number of reads is equivalent to the number of bits in the output digital pattern (i.e. N reads=N bit pattern). In some embodiments, the flash device 102 further includes an analog-to-digital convertor (ADC), such as a flash ADC, configured to provide the N bit pattern for the N read retries.

The N bit pattern is associated with the pattern of selected voltage offsets. In some embodiments, the N bit pattern includes a sequence of zeros representing the number of instances where the cell's nominal voltage is to the left of the read voltages followed by ones to complete the N bit sequence. For example, in a four read-four bit configuration, each read will result in one of the following output sequences: "0000", "0001", "0011", "0111", and "1111". The simplified representation allows for rapid conversion because the nominal voltage can be compared in parallel to the read voltages. Furthermore, the sequential bit patterns simplify detection of invalid patterns (e.g. "0101").

The system 100 further includes a mapping module 106 configured to receive the N bit pattern associated with the N reads. The mapping module 106 is further configured to map each of the N bit patterns into a signed M bit representation of a nominal voltage. In some embodiments, the signed M bit binary representation is a three bit signed representation. In some embodiments, the mapping module 106 is further configured to handle invalid patterns by mapping to the closest valid pattern if the corresponding Hamming distance to the closest valid pattern is smaller than a selected threshold. If the corresponding Hamming distance is not smaller than the selected threshold, the mapping module 106 may be further configured to declare the invalid pattern as erasure. In some embodiments, the mapping module 106 is further configured to set a respective log-likelihood ratio (LLR) of an erasure pattern to a selected value (e.g. LLR=0).

The system 100 further includes an adaptation loop 108 configured to adaptively provide numerical adjustments ($\lambda$) to the signed representation corresponding to the N reads of each cell. The numerical adjustments $\lambda$ are used by a voltage compensator 110, such as an adjustable DC source, to provide a voltage adjustment to the nominal read voltage of the normal read path and the read retry/compensation path. In some embodiments, the adaptation loop 108 is configured for locking the nominal read voltage of the flash device to a value corresponding to a sufficiently reduced bit error rate.

The voltage compensator 110 monitors the numerical adjustment $\lambda$ over multiple cell reads in order to track the read reference voltages $V_A$, $V_B$, and $V_C$. In some embodiments, the read reference voltages $V_A$, $V_B$, and $V_C$ are optimal values or values associated with a sufficiently reduced bit error rate. For LSB reference voltage $V_B$ compensation, if $\lambda>1$ then reduce the read voltage by one voltage step, and if $\lambda<0$ then increase $V_B$ by one voltage offset step. For MSB reference voltage compensations, $\lambda_A$ controls $V_A$ and $\lambda_C$ controls $V_C$. In practice, $\lambda_A$ could be set to equal $\lambda_C$ in which case $V_A$ and $V_C$ are tied together.

Figure 2:
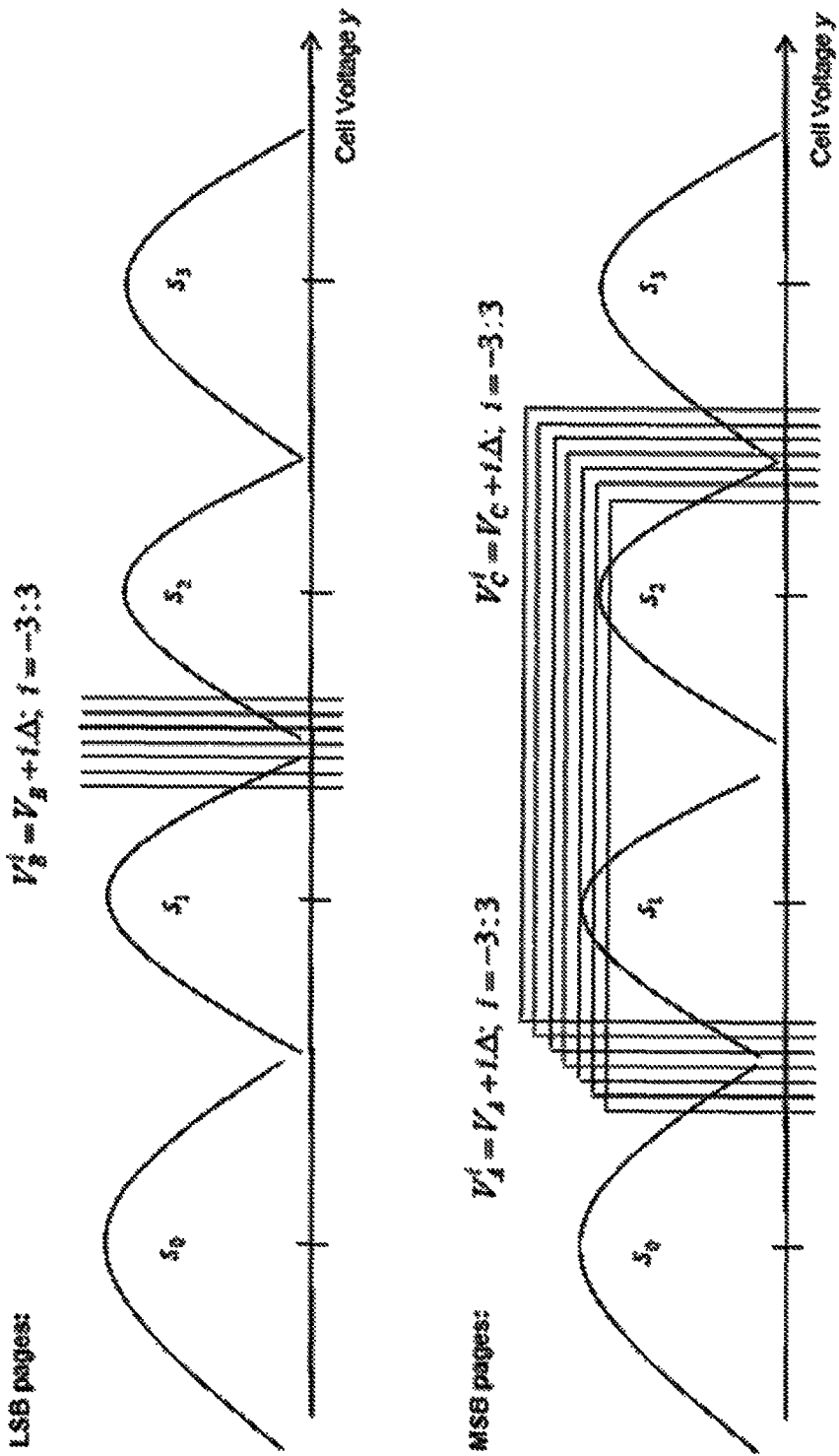
FIG. 2 includes a first graph illustrating a least significant bit (LSB) zone of interest and a second graph illustrating two most significant bit (MSB) zones of interest, in accordance with an embodiment of the disclosure.
Figure 3:
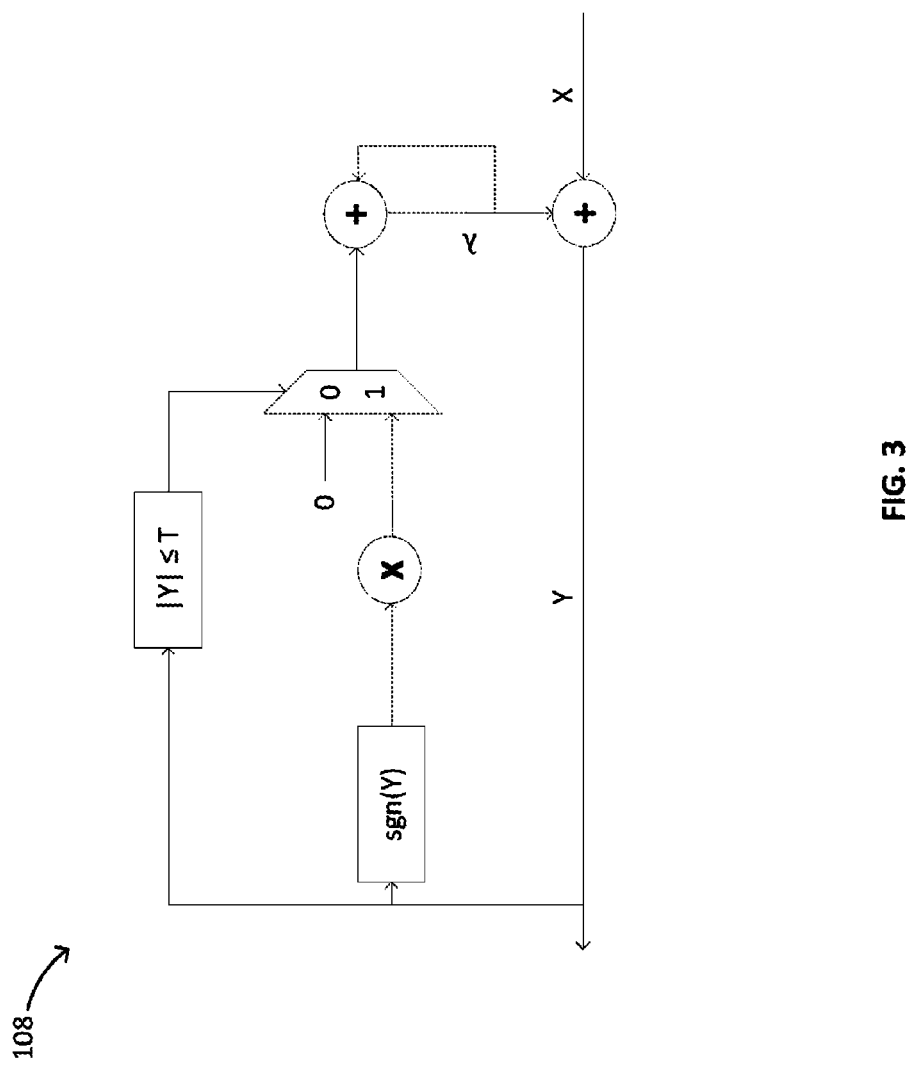
FIG. 3 is a block diagram illustrating an adaptation loop of the system, in accordance with an embodiment of the disclosure.

FIGS. 2 through 5 illustrate most significant bit (MSB) and least significant bit (LSB) zones of interest and adaptation loops 108 designed for treating MSB and LSB blocks or pages. As shown in FIG. 2, there is generally one LSB zone of interest located between state "00" and state "01" and two MSB zones of interest, one located between "11" and "10" (i.e. lower states) and another located between states "00" and "10" (i.e. upper states). FIG. 3 illustrates the adaptation loop 108 configured for LSB states. In some embodiments, the system 100 is simplified by using the adaptation loop 108 illustrated in FIG. 3 to generate voltage adjustments for the LSB and MSB zones. Doing so provides a less complex system 100; however, better performance can be achieved by independently adjusting each of the LSB and MSB zones of interest with respective voltage adjustments, $V_A$ (lower MSB), $V_B$ (LSB), and $V_C$ (upper MSB).

The adaptation loop 108 illustrated in FIG. 3 is configured to apply an initial numerical adjustment ($\lambda_{old}$) to the signed representation (x) associated with the N reads. In some embodiments, the initial numerical adjustment ($\lambda_{old}$) is initiated at a default or predetermined initial value (e.g. zero). In some embodiments, the initial numerical adjustment ($\lambda_{old}$) is initiated at one or more pre-stored values for selected blocks or sets of blocks. The adaptation loop 108 is further configured to determine successive numerical adjustments ($\lambda_{new}$) based on the adjusted value of the signed representation (y). In some embodiments, the numerical adjustment ($\lambda$) is determined in accordance with the following equation: $\lambda_{new}=\lambda_{old}+\mu*\text{sgn}(y)$, where $\mu$ is the adaptation step size, and $\lambda_{new}$ is adjusted only if $|y|\leq T$, where T is a selected threshold.

Figure 4:
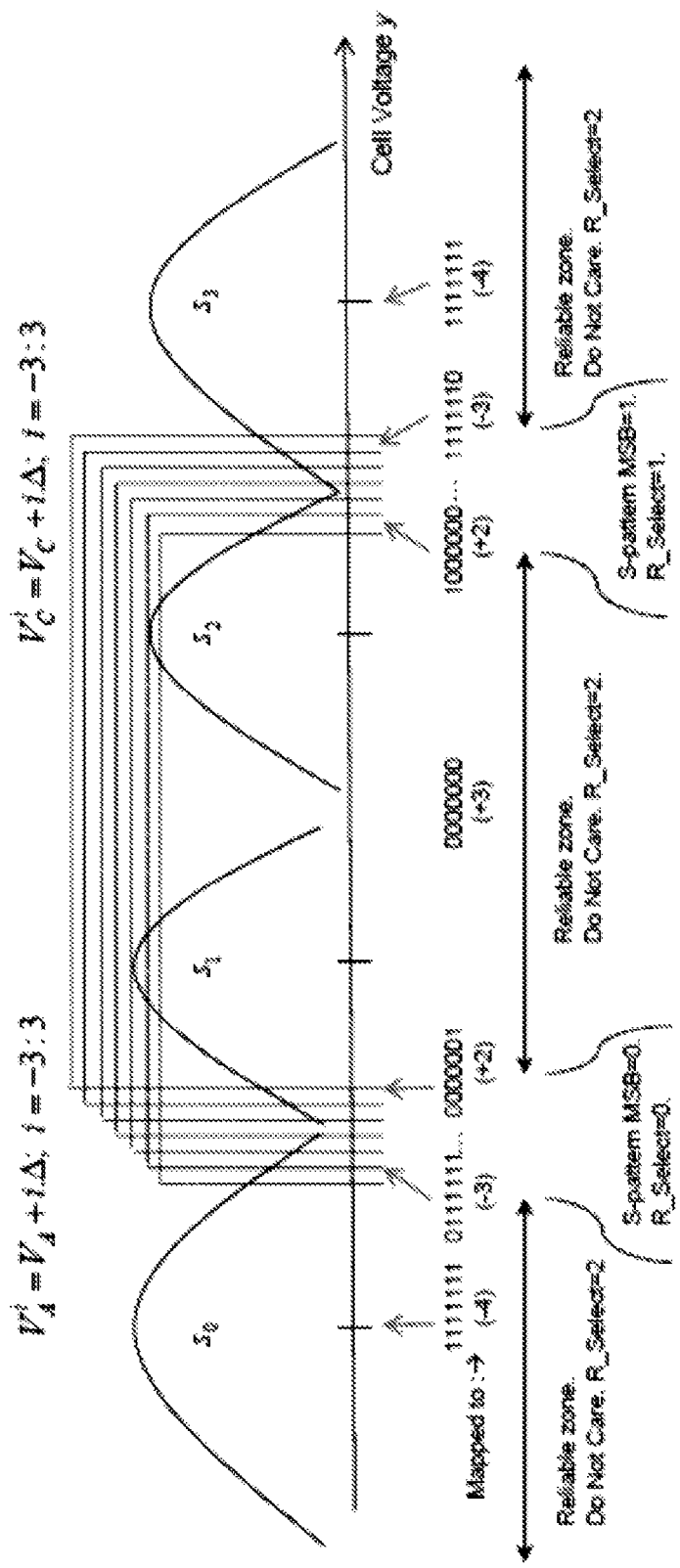
FIG. 4 includes a graph illustrating the two most significant bit (MSB) zones of interest, wherein digital patterns are assigned to a first MSB zone of interest and a second MSB zone of interest, in accordance with an embodiment of the disclosure.
Figure 5:
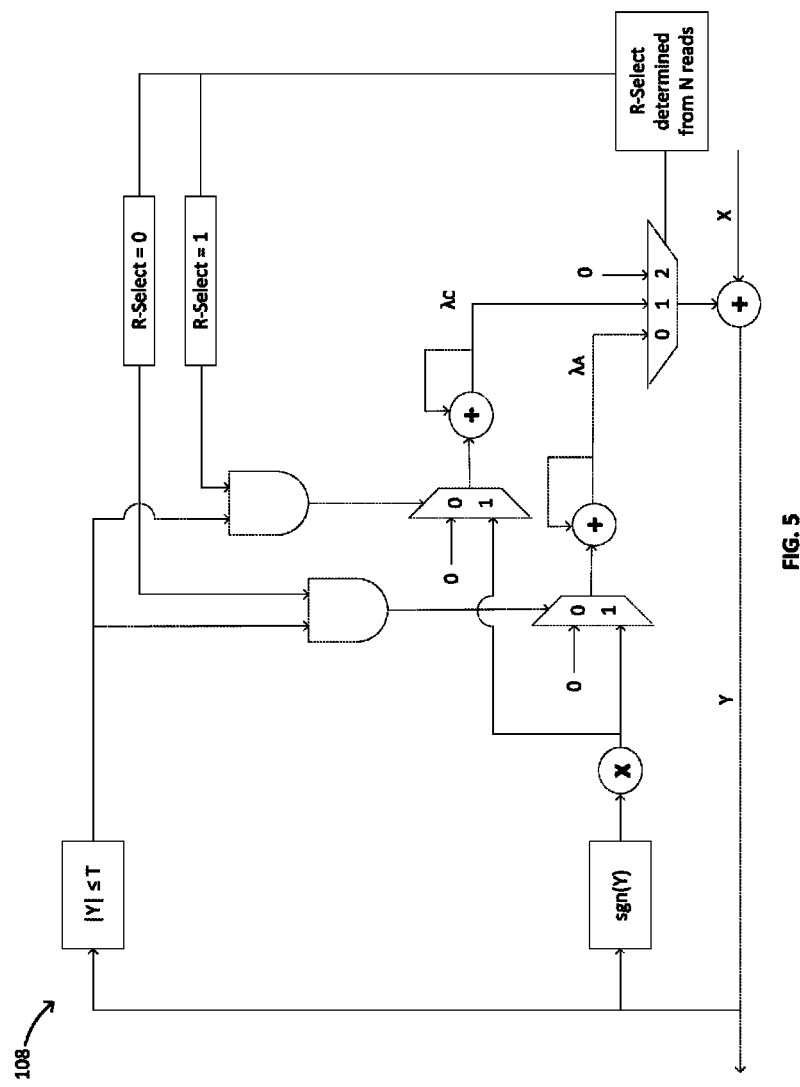
FIG. 5 is a block diagram illustrating an adaptation loop of the system configured to apply a first adaptation path for nominal voltages falling in the first MSB zone of interest and a second adaptation path for nominal voltages falling in the second MSB zone of interest, in accordance with an embodiment of the disclosure.

FIG. 4 illustrates different zones of interest for MSB pages or blocks. A first zone (R_select=0) is associated with the lower MSB states "11" and "10" and a second zone (R_select=1) is associated with the upper MSB states "00" and "10". All other regions (R_select=2) are reliable or belong to LSB pages or blocks, accordingly voltages falling in R_select=2 regions for MSB pages or blocks can be ignored. In some embodiments, as illustrated in FIG. 5, the adaptation loop 108 is designed to handle R_select=1 inputs and R_select=2 with different adaptation paths. In some embodiments, each adaptation path has a respective numerical adjustment ($\lambda_A$ and $\lambda_C$) and a respective adaptation step size ($\mu_A$ and $\mu_B$). By allowing different adaptation loops for the LSB zone of interest each of the MSB zones of interest it is possible to achieve better reduction in bit error rate because the nominal read voltage adjustments ($V_A$, $V_B$, and $V_C$) are tailored to each zone of interest.

In some embodiments, the adaptation loop 108 is further configured to bring the zero-crossing point in a distribution of LLR values to the nominal read voltage. In some embodiments, the compensation loop is further configured to track offset variations per page or block over time. The compensation loop can be enabled during read-retry mode or at selected times (as previously discussed). In some embodiments, it is advantageous to enable the compensation loop at selected times (e.g. periodically, idle moments, startup, etc.) to control the read voltage for selected blocks or pages or to test for endurance or voltage retention.

In some embodiments, where the compensation loop is integrated with the read retry path of a read channel (see FIG. 1), an LLR calculation module 112 is configured to receive the adjusted signed representation values (y) associated with the N reads. The LLR calculation module 112 is further configured to determine LLR values based upon the adjusted values (y). In some embodiments, LLR values are determined for the N reads in accordance with the following equation: LLR=K(y)*y, where K(y) is a constant based upon the adjusted values (y). In some embodiments, K(y) is characterized by at least two constants including a first constant (Kp) and a second constant (Kn), such that K(y)=Kp when y≥0, and K(y)=Kn when y≤0. The constants (Kp) and (Kn) are selected based on the distribution of various states of interest. In some embodiments, for LSB blocks or pages a distinction is made between state "00" and state "01" and Kp and Kn are selected based on a respective distribution of each state. For MSB blocks or pages, a similar distinction and selection is made between states "11" and "10" (i.e. lower states) and states "00" and "10" (i.e. upper states). Accordingly, the LLR calculation module 112 employs six Kp,Kn gain values corresponding to the tails of interest for raw bit error rate (BER), namely the left and right tails between states "11" and "01" (lower MSB states), states "01" and "00" (LSB states), and states "00" and "10" (upper MSB states), respectively. In some embodiments, the six Kp,Kn gains are in a reduced set to further simplify the LLR calculation.

In some embodiments, Kp or Kn values are determined utilizing a distribution of the adjusted (y) values. The distributions of one or more positive and negative values (V) are utilized to pick Kp or Kn. Consider an embodiment where V=2. The number N(2) of hits where y=+2 and y=−2 are counted within a selected time window and compared against a selected count threshold (Th). Then if N(2)>Th, Kp=1, otherwise Kp=2. Similarly, if N(−2)>Th, Kn=1, otherwise Kn=2. The foregoing embodiment is illustrative of the concept for selecting Kp and Kn constants. Accordingly, the values used are intended as examples and not limitations of the disclosure.

In some embodiments, incorporating the compensation loop into the read retry (and LLR generation) path allows for automatic offset compensation in LLR determination because the compensation loop is enabled to blindly converge to an offset that reduces raw BER. In some embodiments, the compensation loop further includes or is in communication with a controller configured to keep track of read voltages for selected pages or blocks. Accordingly, the compensation loop can be used for retention testing and retention voltage shift detection.

The mapping module 106, adaptation loop 108, and LLR calculation module 112 described above include any combined or separated configuration of hardware, software, and/or firmware enabled to perform the functions or steps described herein. In some embodiments, any of the foregoing components of system 100 are implemented by one or more processors configured to execute program instructions from carrier media. In some embodiments, electronic circuitry is further employed. Many hardware, software, and firmware combinations are contemplated for implementing the foregoing components of system 100, among others. Accordingly, none of the embodiments described herein should be construed as limitations.

Figure 6:
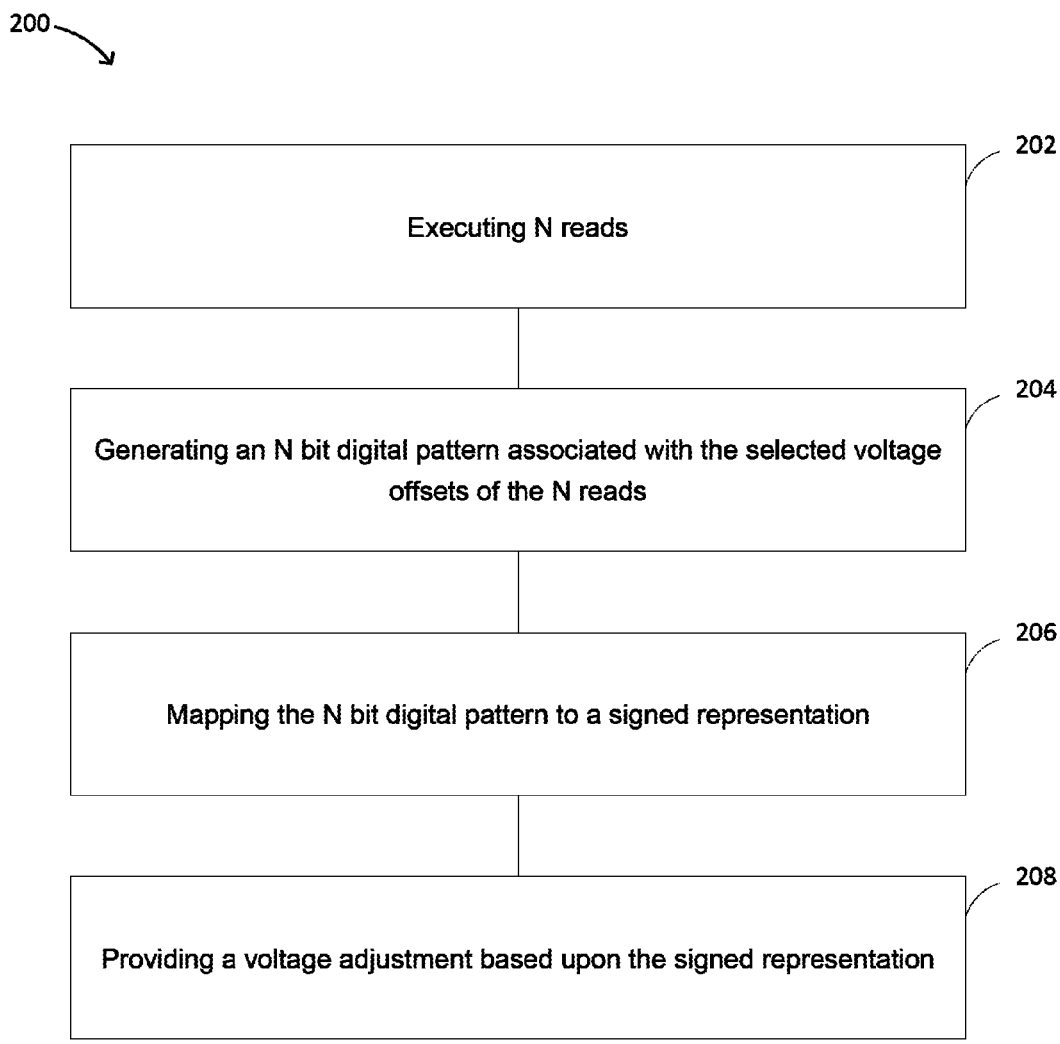
FIG. 6 is a flow diagram illustrating a method of compensating a nominal read voltage variation, in accordance with an embodiment of the disclosure.

FIG. 6 is a flow diagram illustrating an embodiment of a method 200 for compensating variations in nominal read voltage of a flash device 102. System 100 is a manifestation of method 200 and all steps or features described with regard to embodiments of system 100 or method 200 are applicable to both the system 100 and method 200. However, it is noted that one or more steps of method 200 may be executed via other means known to the art. Accordingly method 200 should be broadly construed to encompass any acceptable means for carrying out the steps described below.

At step 202, N reads are performed as part of compensation or read retry path. Each of the N reads is performed at a selected voltage offset from the initial read voltage. Step 202 is initialized at a selected time (e.g. periodically, pre-set time, manually initiated) or upon the occurrence of a specified event (e.g. read failure, corrupted read, system idle, startup). At step 204, an N bit digital pattern is generated for the N reads. The N bit digital pattern is associated with the respective voltage offsets of the N reads. At step 206, the N bit digital pattern is mapped to an M bit signed representation of the nominal read voltage (i.e. a selected or pre-determined voltage). At step 208, a voltage adjustment is applied based on the signed representation. In some embodiments, a compensation loop adaptively generates a voltage adjustment offset to adjust the nominal read voltage up or down. The compensation loop adaptively provides new voltage adjustments for a selected number of cycles or until a threshold voltage is achieved. Accordingly, the nominal read voltage variations are digitally compensated without prior knowledge of optimal or ideal offset values.

It should be recognized that in some embodiments the various functions or steps described throughout the present disclosure may be carried out by any combination of hardware, software, or firmware. In some embodiments, various steps or functions are carried out by one or more of the following: electronic circuits, logic gates, field programmable gate arrays, multiplexers, or computing systems. A computing system may include, but is not limited to, a personal computing system, mainframe computing system, workstation, image computer, parallel processor, or any other device known in the art. In general, the term "computing system" is broadly defined to encompass any device having one or more processors, which execute instructions from a memory medium.

Program instructions implementing methods, such as those manifested by embodiments described herein, may be transmitted over or stored on carrier medium. The carrier medium may be a transmission medium, such as, but not limited to, a wire, cable, or wireless transmission link. The carrier medium may also include a storage medium such as, but not limited to, a read-only memory, a random access memory, a magnetic or optical disk, or a magnetic tape.

Embodiments manifesting methods described herein may include storing results in a storage medium. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that any embodiment of the disclosure manifested above as a system or method may include at least a portion of any other embodiment described herein. Those having skill in the art will appreciate that there are various embodiments by which systems and methods described herein can be effected, and that the implementation will vary with the context in which an embodiment of the disclosure deployed.

Furthermore, it is to be understood that the invention is defined by the appended claims. Although embodiments of this invention have been illustrated, it is apparent that various modifications may be made by those skilled in the art without departing from the scope and spirit of the disclosure.

What is claimed is:

1. A system for compensating nominal voltage variations of a flash device, comprising:
 a flash device configured to execute N reads, each of the N reads having a selected voltage offset from an initial nominal read voltage, the N reads generating an N bit digital pattern associated with the selected voltage offsets;
 a mapping module configured to receive the N bit digital pattern generated by the N reads, the mapping module further configured to map the N bit digital pattern to a signed representation; and
 a voltage compensator configured to provide a voltage adjustment based upon the signed representation to at least partially compensate for a variation of the nominal read voltage.

2. The system of claim 1, wherein the flash device includes a flash analog-to-digital converter configured to generate the N bit digital pattern associated with the N reads.

3. The system of claim 1, wherein the system is configured to compensate for nominal voltage variations after a selected number of memory cycles occur or after a read failure occurs.

4. The system of claim 1, further comprising:
 an adaptation loop configured to receive the signed representation from the mapping module, the adaptation loop further configured to adaptively provide one or more numerical adjustments based upon the magnitude and sign of the signed representation, wherein the voltage adjustment is determined utilizing the one or more numerical adjustments from the adaptation loop.

5. A system for compensating nominal voltage variations of a flash device, comprising:

a flash device configured to execute N reads, each of the N reads having a selected voltage offset from an initial nominal read voltage, the N reads generating an N bit digital pattern associated with the selected voltage offsets;

a mapping module configured to receive the N bit digital pattern generated by the N reads, the mapping module further configured to map the N bit digital pattern to a signed representation;

an adaptation loop configured to receive the signed representation from the mapping module, the adaptation loop further configured to adaptively provide one or more numerical adjustments based upon the magnitude and sign of the signed representation;

a voltage compensator configured to provide a voltage adjustment based upon the one or more numerical adjustments from the adaptation loop to at least partially compensate for a variation of the nominal read voltage; and a calculation module configured to determine a log-likelihood ratio based upon an adjusted nominal read voltage.

6. The system of claim 5, wherein the log-likelihood ratio (LLR) is determined in accordance with the following equation:

$$LLR = K(y)*y,$$

where y is the adjusted read voltage, and K(y) is a constant based upon y.

7. The system of claim 6, wherein
$K(y)=Kp$ when y is not less than zero, and
$K(y)=Kn$ when y is less than zero,
where Kp and Kn are selected constants.

8. The system of claim 7, wherein Kp and Kn are determined utilizing a distribution of values for y.

9. The system of claim 5, wherein the system is configured to compensate for nominal voltage variations after a read failure occurs.

10. The system of claim 5, wherein the flash device includes a flash analog-to-digital converter configured to generate the N bit digital pattern associated with the N reads.

11. The system of claim 5, wherein the signed representation includes a three bit signed binary representation.

12. The system of claim 5, wherein the system includes at least a portion of a read-retry pathway.

13. A method of compensating nominal voltage variations of a flash device, comprising:

executing N reads, each of the N reads having a selected voltage offset from an initial nominal read voltage;

generating an N bit digital pattern associated with the selected voltage offsets;

mapping the N bit digital pattern to a signed representation; and providing a voltage adjustment based upon the signed representation to at least partially compensate for a variation of the nominal read voltage.

14. The method of claim 13, further comprising:
adaptively providing one or more numerical adjustments based upon the magnitude and sign of the signed representation, wherein the voltage adjustment is determined utilizing the one or more numerical adjustments.

15. The method of claim 13, further comprising:
detecting at least one of a selected number of memory cycles or a read failure.

16. The method of claim 13, wherein the N bit digital pattern is an output from a flash analog-to-digital converter.

17. The method of claim 13, further comprising:
determining a log-likelihood ratio based upon an adjusted nominal read voltage.

18. The method of claim 17, wherein the log-likelihood ratio (LLR) is determined in accordance with the following equation:

$$LLR = K(y)*y,$$

where y is the adjusted read voltage, and K(y) is a constant based upon y.

19. The method of claim 18, wherein
$K(y)=Kp$ when y is not less than zero, and
$K(y)=Kn$ when y is less than zero,
where Kp and Kn are selected constants.

20. The method of claim 19, wherein Kp and Kn are determined utilizing a distribution of values for y.

* * * * *